(12) United States Patent
Suo et al.

(10) Patent No.: US 11,818,939 B2
(45) Date of Patent: Nov. 14, 2023

(54) DISPLAY PANEL AND ELECTRONIC DEVICE

(71) Applicants: Wuhan Tianma Micro-Electronics Co., Ltd., Wuhan (CN); Wuhan Tianma Microelectronics Co., Ltd. Shanghai Branch, Shanghai (CN)

(72) Inventors: Lei Suo, Shanghai (CN); Rucuo Wei, Shanghai (CN); Cheng Tang, Shanghai (CN)

(73) Assignees: WUHAN TIANMA MICRO-ELECTRONICS CO., LTD., Wuhan (CN); WUHAN TIANMA MICROELECTRONICS CO., LTD, SHANGHAI BRANCH, Shanghai (CN)

( * ) Notice: Subject to any disclaimer, the term of this patent is extended or adjusted under 35 U.S.C. 154(b) by 479 days.

(21) Appl. No.: 17/166,616

(22) Filed: Feb. 3, 2021

(65) Prior Publication Data

US 2022/0173173 A1 Jun. 2, 2022

(30) Foreign Application Priority Data

Nov. 30, 2020 (CN) .......................... 202011372899.1

(51) Int. Cl.
*H10K 59/60* (2023.01)
*G02F 1/133* (2006.01)
*G02F 1/1368* (2006.01)
*H10K 59/123* (2023.01)

(52) U.S. Cl.
CPC ......... *H10K 59/60* (2023.02); *G02F 1/13312* (2021.01); *G02F 1/13685* (2021.01); *H10K 59/123* (2023.02)

(58) Field of Classification Search
CPC ............. G02F 1/13312; G02F 1/13318; G02F 1/133354; G06F 1/1601–1611; G06F 1/1637–1654; H04M 1/0266–027; H10K 59/13; H10K 59/60
See application file for complete search history.

(56) References Cited

U.S. PATENT DOCUMENTS

2020/0194528 A1* 6/2020 Song ................... H10K 59/131

FOREIGN PATENT DOCUMENTS

| CN | 107979698 B | 5/2020 |
| CN | 107424579 B | 6/2020 |

\* cited by examiner

*Primary Examiner* — Daniel P Shook
(74) *Attorney, Agent, or Firm* — Anova Law Group, PLLC (57) ABSTRACT

A display panel and an electronic device are provided. The display panel includes a substrate including a display area and a frame area surrounding the display area, a plurality of sub-pixels located in the display area, and a plurality of pins and a plurality of alignment marks located in the frame area. The plurality of pins includes a first pin and a second pin. At least one alignment mark of the plurality of alignment marks is a first photosensitive element. The first photosensitive element is connected to the first pin. The second pin is connected to the plurality of sub-pixels.

20 Claims, 10 Drawing Sheets

Figure 19

# DISPLAY PANEL AND ELECTRONIC DEVICE

CROSS-REFERENCE TO RELATED APPLICATION

This application claims priority of Chinese Patent Application No. 202011372899.1, filed on Nov. 30, 2020, the entire content of which is hereby incorporated by reference.

FIELD OF THE DISCLOSURE

The present disclosure generally relates to the field of electronic device technology and, more particularly, relates to a display panel and an electronic device.

BACKGROUND

With continuous development of science and technology, more and more electronic devices with display functions are widely used in people's daily life and work, bringing great convenience to people's daily life and work, and becoming indispensable tools for people nowadays. A main component for an electronic device to realize a display function is a display panel.

Figure 1:
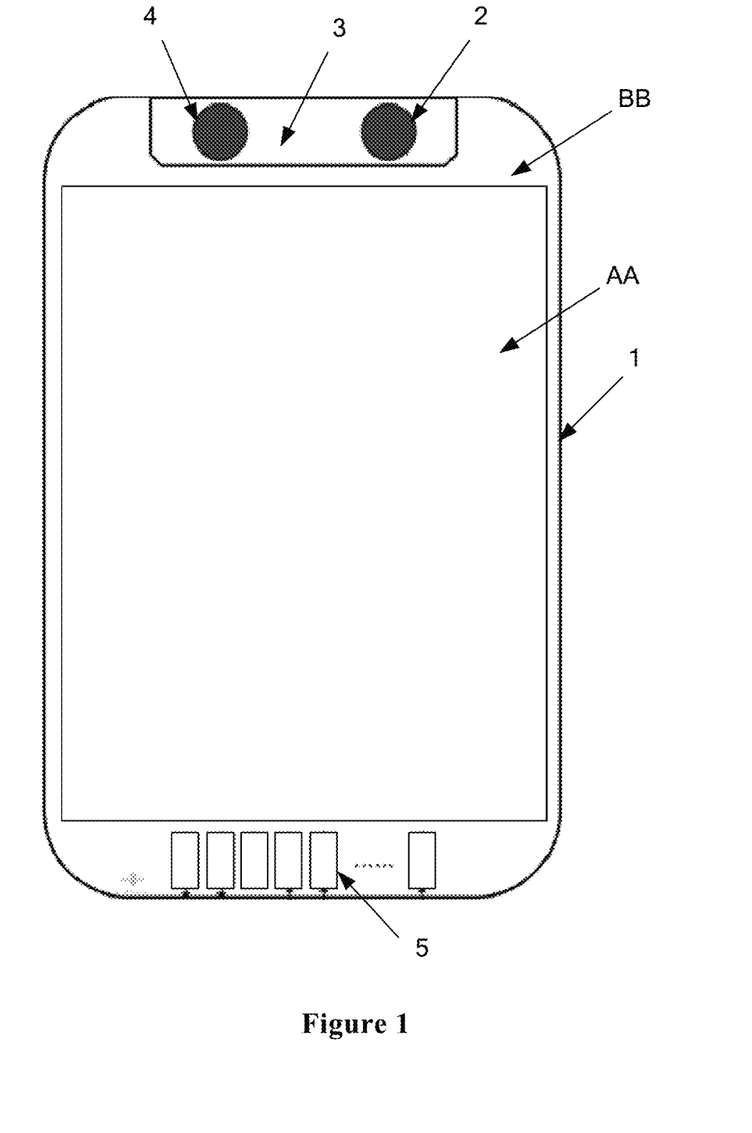
FIG. 1 illustrates a schematic structural diagram of an existing electronic device.

FIG. 1 illustrates a schematic structural diagram of an existing electronic device. The electronic device includes a display panel 1. The display panel 1 includes a display area AA and a frame area BB. The frame area BB includes a pin 5 for circuit interconnection. To integrate a function of detecting ambient light, the display panel 1 may include a groove 3. A photosensitive sensor 2 may be disposed in the groove 3. A camera 4 may also be integrated in the groove 3.

To integrate a function of detecting ambient light, the display panel 1 may include the groove 3, such that a photosensitive element may be disposed. Accordingly, a production cost may be high, and a screen-to-body ratio of the display panel may be affected.

The disclosed structures and methods are directed to solve one or more problems set forth above and other problems in the art.

SUMMARY

One aspect of the present disclosure includes a display panel. The display panel includes a substrate including a display area and a frame area surrounding the display area, a plurality of sub-pixels located in the display area, and a plurality of pins and a plurality of alignment marks located in the frame area. The plurality of pins includes a first pin and a second pin. At least one alignment mark of the plurality of alignment marks is a first photosensitive element. The first photosensitive element is connected to the first pin. The second pin is connected to the plurality of sub-pixels.

Another aspect of the present disclosure includes an electronic device. The electronic device includes a display panel, and a main board located on a side of the display panel facing away from the light-emitting side. The display panel includes a substrate including a display area and a frame area surrounding the display area, a plurality of sub-pixels located in the display area, and a plurality of pins and a plurality of alignment marks located in the frame area. The plurality of pins includes a first pin and a second pin. At least one alignment mark of the plurality of alignment marks is a first photosensitive element. The first photosensitive element is connected to the first pin. The second pin is connected to the plurality of sub-pixels. The first pin and the second pin of the display panel are connected to the main board.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Reference will now be made in detail to exemplary embodiments of the present disclosure, which are illustrated in the accompanying drawings. Wherever possible, the same reference numbers will be used throughout the drawings to refer to the same or like parts.

It should be noted that relative arrangements of components and steps, numerical expressions and numerical values set forth in exemplary embodiments are for illustration purpose only and are not intended to limit the present disclosure unless otherwise specified. Techniques, methods and apparatus known to the skilled in the relevant art may not be discussed in detail, but these techniques, methods and apparatus should be considered as a part of the specification, where appropriate.

It should be noted that, in the present disclosure, terms "upper", "lower", "top", "bottom", "inner, "outer" and the like indicate orientational or positional relationships based on orientational or positional relationships shown in the accompanying drawings, and are only for description convenience and simpleness of the present disclosure. These terms do not indicate or imply that a corresponding device or element should have a specific orientation, or should be constructed or operated in a specific orientation. These terms cannot be understood as a limit to the present disclosure. When a component is considered to be "connected" to another component, the component may be directly connected to another component, or other components may exist between the component and the another component at same time.

It should be noted that, in the present disclosure, relational terms such as "first" and "second" are used only to distinguish one entity or operation from another entity or operation, and do not necessarily require or imply any such actual relationship or order between these entities or operations. Moreover, terms "include", "comprise" or any other variations thereof are intended to cover non-exclusive inclusion. A process, a method, an article, or an equipment including a series of elements may not only include those elements, but also include other elements that are not explicitly listed, or elements inherent to the process, the method, the article, or the equipment. Without additional restrictions, when a phrase "including . . . " is used to identify an element, other identical elements may exist in a process, a method, an article, or a device including the element.

It should be understood that, in describing a structure of a component, when a layer or a region is referred to as being "on" or "above" another layer or another region, the layer or the region may be directly on the other layer or the other region, or additional layers or additional regions may be included between the layer or the region and the other layer or the other region. Moreover, if the component is turned over, the layer or the region is "below" or "under" the other layer or the other region.

Figure 2:
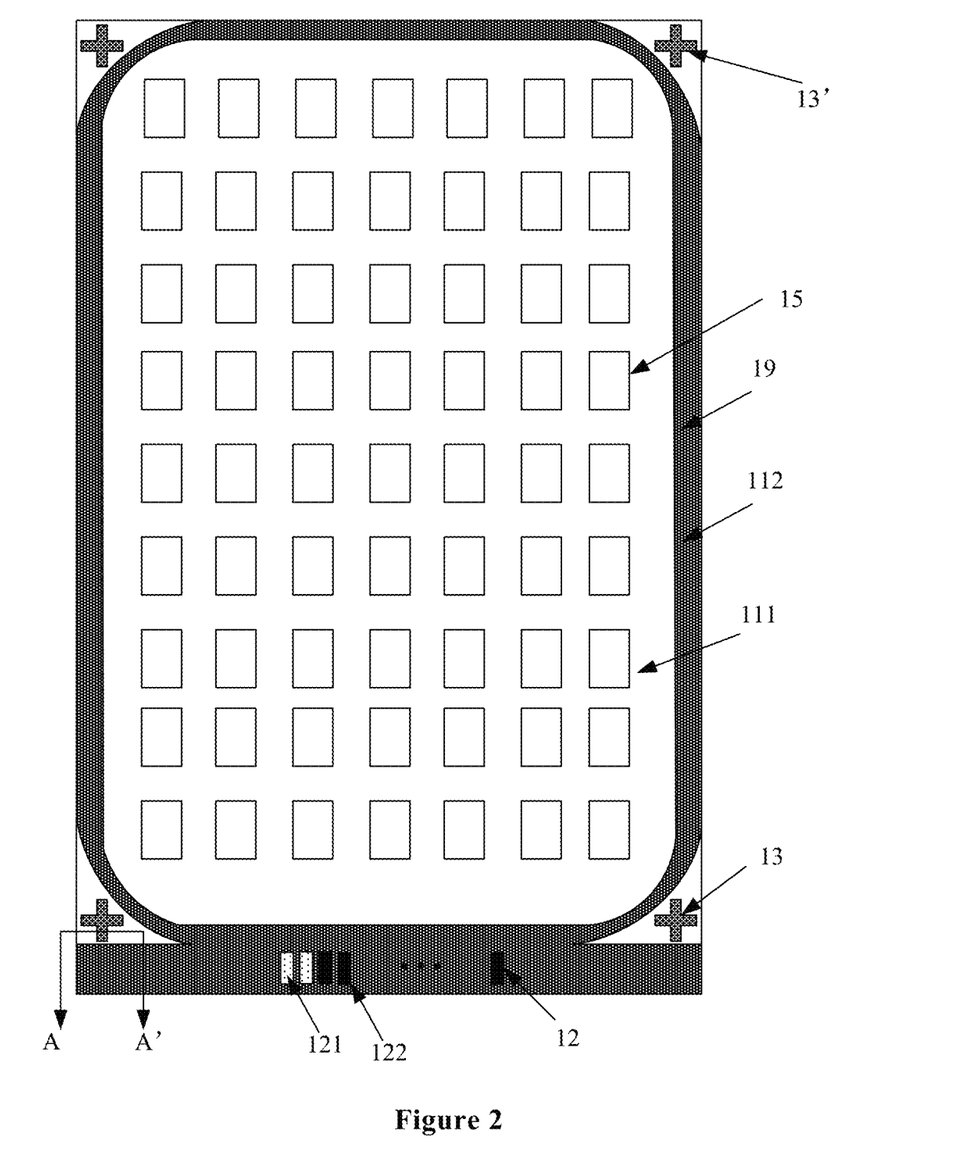
FIG. 2 illustrates a top view of a display panel consistent with the disclosed embodiments of the present disclosure.
Figure 3:
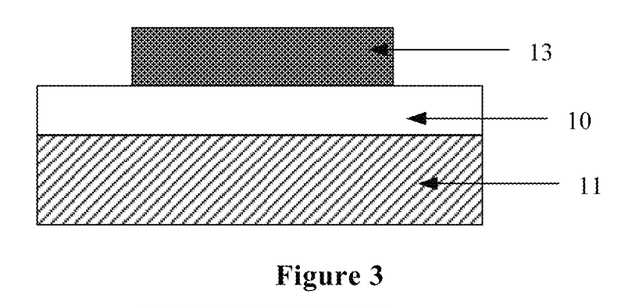
FIG. 3 illustrates a cross-sectional view along direction A-A' of a display panel shown in FIG. 2, consistent with the disclosed embodiments of the present disclosure.

FIG. 2 illustrates a top view of a display panel consistent with the disclosed embodiments of the present disclosure. FIG. 3 illustrates a cross-sectional view along direction A-A' of a display panel shown in FIG. 2. As shown in FIG. 2 and FIG. 3, the display panel includes a substrate 11 including a display area 111 and a frame area 112 surrounding the display area 111, a plurality of sub-pixels 15 located in the display area 111, a plurality of pins 12 and a plurality of alignment marks 13' located in the frame area 112. The plurality of pins 12 include a first pin 121 and a second pin 122.

At least one of the plurality of alignment marks 13' is a first photosensitive element 13. The first photosensitive element 13 is connected to the first pin 121. The second pin 122 is connected to the plurality of sub-pixels 15. The plurality of sub-pixels 15 may be arranged in an array.

In the display panel, each of four top corners of the frame area 112 is disposed with one alignment mark 13' respectively. The alignment mark 13' may have a cross shape, or other geometric shapes. In one embodiment, a position of one or more alignment marks 13' may be multiplexed to make the first photosensitive element 13 capable of sensing light information. The first photosensitive element 13 and the alignment mark 13' may have a same a geometric structure. In this way, on one hand, during an alignment operation, the first photosensitive element 13 may be used as a reference mark for position alignment. On the other hand, the first photosensitive element 13 may also be used to detect light signals.

In a display panel according to one embodiment of the present disclosure, at least one alignment mark 13' in the frame area 112 is multiplexed as the first photosensitive element 13. In this way, the first photosensitive element 13 may not occupy an area of the display area 111. Compared with an existing technology, the display panel provided by the present disclosure may not need a groove to integrate a photosensitive sensor for detecting ambient light. Accordingly, a production cost may be reduced, and a screen-to-body ratio of the display panel may be increased. A front camera of the display panel may be disposed as an underscreen camera, or may have a groove design. When a front camera integrated in a groove is used, a photosensitive sensor for detecting ambient light may not be integrated in the groove, and the groove size may thus be reduced.

It should be noted that, in the present disclosure, shapes of the first photosensitive element 13 and the alignment mark 13' may be set based on requirements, and are not limited to a cross shape shown in FIG. 2. A vertical projection of the first photosensitive element 13 on a plane where the substrate 11 is located may be any one of a cross shape, a circle shape, a polygon shape, an ellipse shape, a straight-line shape, and a polyline shape. The shape of the alignment mark 13' may be arbitrarily set based on requirements, provided that the shapes of the first photosensitive element 13 and the alignment mark 13' are consistent. In this way, the first photosensitive element 13 may have photosensitive characteristics, and meanwhile may be multiplexed as the alignment mark 13'.

The display panel may include a cover plate (not shown in FIG. 2). The cover plate may be disposed on a side of the sub-pixel 15 away from the substrate 11. A surface of the cover plate may have an ink layer 19, and the ink layer 19 is located on a surface of the cover plate facing the substrate 11. The ink layer 19 exposes the display area 111 and the first photosensitive element 13.

As shown in FIG. 2, in this configuration, the display area has a rounded rectangle shape. The frame area adjacent to each of four rounded areas of the rounded rectangle shape is disposed with the alignment marks 13'. The ink layer 19 exposes the four first photosensitive elements 13 at the four rounded areas.

Figure 4:
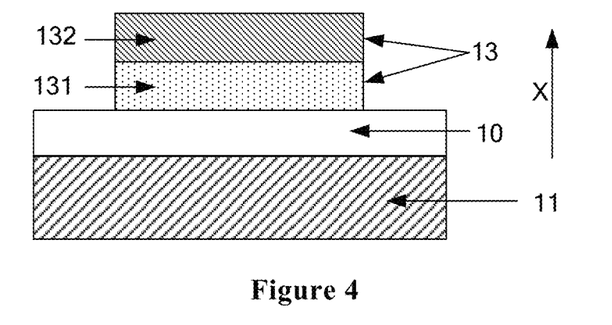
FIG. 4 illustrates a schematic structural diagram of a first photosensitive element consistent with the disclosed embodiments of the present disclosure.

FIG. 4 illustrates a schematic structural diagram of a first photosensitive element consistent with the disclosed embodiments of the present disclosure. As shown in FIG. 4, based on the configurations shown in FIG. 2 and FIG. 3, the first photosensitive element 13 includes a first semiconductor layer 131 and a second semiconductor layer 132 that are stacked in a first direction X. One of the first semiconductor layer 131 and the second semiconductor layer 132 is a P-type semiconductor layer, and the other is an N-type semiconductor layer. The first direction X is directed from the substrate 11 to the sub-pixels 15. An isolation layer 10 is disposed between the first photosensitive element 13 and the substrate 11. The isolation layer 10 is an existing layer structure on the substrate 11 of the display panel. In this way, the first photosensitive element 13 for detecting light signals may be realized by a simple PN diode.

It should be noted that, in the present disclosure, stacking of two structures includes direct-contact stacking between the two structures or indirect stacking through an intermediate layer structure.

Figure 5:
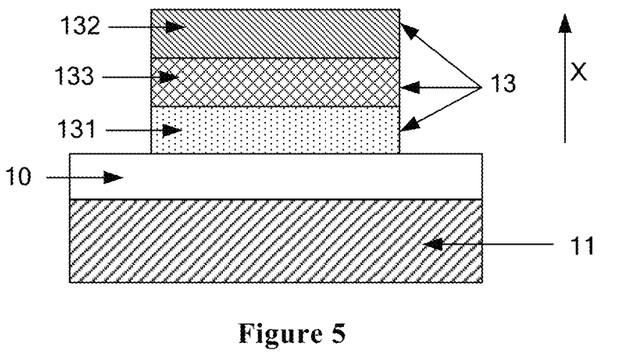
FIG. 5 illustrates a schematic structural diagram of another first photosensitive element consistent with the disclosed embodiments of the present disclosure.

FIG. 5 illustrates a schematic structural diagram of another first photosensitive element consistent with the disclosed embodiments of the present disclosure. Based on the configuration shown in FIG. 4, a configuration shown in FIG. 5 further includes an intrinsic semiconductor layer 133 located between the first semiconductor layer 131 and the second semiconductor layer 132. In this way, the first photosensitive element 13 for detecting light signals may be realized by a simple PIN diode.

The intrinsic semiconductor layer 133 is a pure semiconductor without impurities and lattice defects, and generally refers to a pure semiconductor material with conductivity mainly determined by intrinsic excitation of the pure semiconductor material. The intrinsic semiconductor layer may be made of a material including silicon (Si), germanium (Ge), gallium arsenide (GaAs), and so on.

Figure 6:
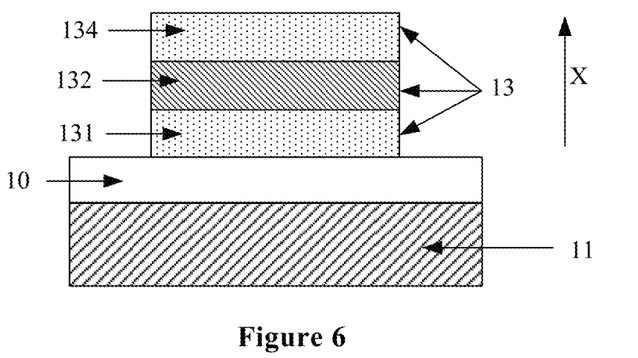
FIG. 6 illustrates a schematic structural diagram of another first photosensitive element consistent with the disclosed embodiments of the present disclosure.

FIG. 6 illustrates a schematic structural diagram of another first photosensitive element consistent with the disclosed embodiments of the present disclosure. Based on the configuration shown in FIG. 4, a configuration shown in FIG. 6 further includes a third semiconductor layer 134 located on a side of the second semiconductor layer 132 facing away from the first semiconductor layer 131. The first semiconductor layer 131 and the third semiconductor layer 134 have a same doping type. In one embodiment, to achieve a photosensitive function, each of the first conductive layer 131 and the third semiconductor layer 134 is an N-type semiconductor layer, and the second semiconductor layer 132 is a P-type semiconductor layer. Accordingly, an NPN photosensitive transistor may be formed, and the first photosensitive element 13 for detecting light signals may thus be realized.

In the present disclosure, the P-type semiconductor layer refers to a semiconductor layer doped with P-type ions. The P-type ions are generally elements with 3 valence electrons, such as boron. The N-type semiconductor layer refers to a semiconductor layer doped with N-type ions. The N-type ions are generally an element with 5 valence electrons, such as phosphorus or arsenic.

Figure 7:
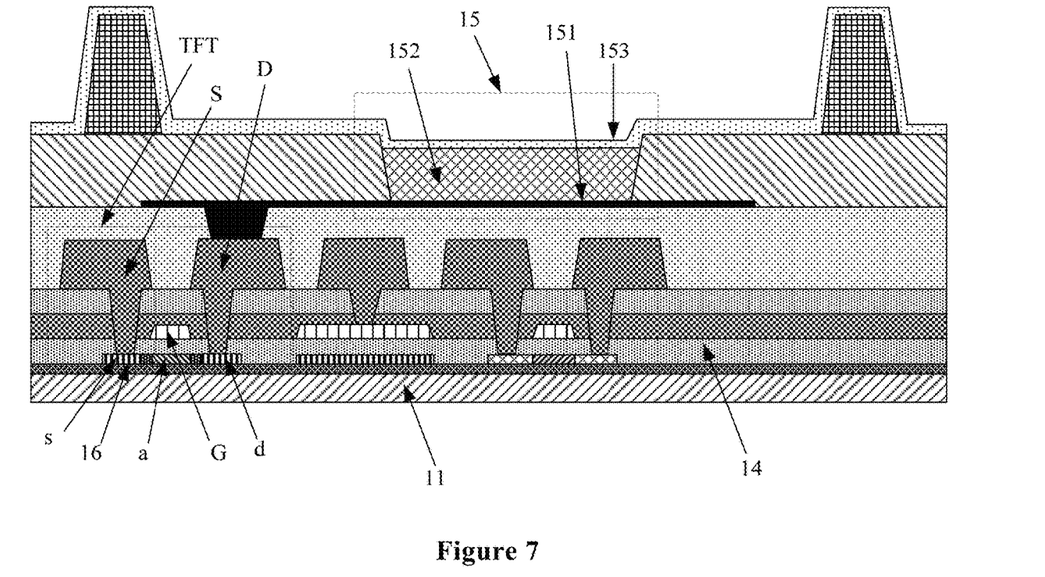
FIG. 7 illustrates a cross-sectional view of a display panel consistent with the disclosed embodiments of the present disclosure.

FIG. 7 illustrates a cross-sectional view of a display panel consistent with the disclosed embodiments of the present disclosure. In combination with FIGS. 2 to 6, in the display panel shown in FIG. 7, the second pin 122 is connected to the sub-pixel 15 through a driving circuit. The driving circuit includes a thin film transistor TFT.

The thin film transistor TFT includes an active layer 16. The active layer 16 includes a source region s and a drain region d, and a channel region a located between the source region s and the drain region d. The source region s and the drain region d have a same doping type, and the source region s and the channel region a have different doping types. One of the source region s and the channel region a has N-type doping, and the other has P-type doping. The first semiconductor layer 131 and the channel region a are made of a same material. The second semiconductor layer 132, the source region s, and the drain region d are made of a same material.

One of the source region s and the channel region a is a P-type semiconductor layer, and the other is an N-type semiconductor layer. When the channel region a is a P-type semiconductor layer, a P-type semiconductor layer (such as P-type silicon) may be formed first as the active layer 16. Then, an ion implantation process of N-type heavy doping may be performed on two ends of the active layer 16, forming N-type doped source region s and drain region d. In one embodiment, each of the source region s and the drain region d is made of N-type silicon, and is an N-type semiconductor layer. When the channel region a is an N-type semiconductor layer, an N-type semiconductor layer (such as N-type silicon) may be formed first as the active layer 16. Then, an ion implantation process of P-type heavy doping may be performed on two ends of the active layer 16, forming P-type doped source region s and drain region d. In one embodiment, each of the source region s and the drain region d is made of P-type silicon, and is a P-type semiconductor layer.

In a configuration shown in FIG. 7, the semiconductor layer of the thin film transistor TFT in the driving circuit may be directly multiplexed to prepare the first semiconductor layer 131 and the second semiconductor layer 132 in the first photosensitive element 13. Thus, the production cost may be low, and the production process may be simple.

In fabrication of the first photosensitive element 13 shown in FIG. 4, when the active layer 16 of the thin film transistor TFT is fabricated, the first semiconductor layer 131 may be simultaneously formed at a corresponding position of the frame area 112 where the alignment mark 13' needs to be fabricated. When the source region s and the drain region d of the thin film transistor TFT are formed, ion doping may be simultaneously performed in a surface of the first semiconductor layer 131, converting a portion of the first semiconductor layer 131 into the second semiconductor layer 132.

In fabrication of the first photosensitive element 13 shown in FIG. 5, when the active layer 16 of the thin film transistor TFT is fabricated, the first semiconductor layer 131 may be simultaneously formed at a corresponding position of the frame area 112 where the alignment mark 13' needs to be fabricated. After the intrinsic semiconductor layer 133 is formed on the first semiconductor layer 131, the source region s and the drain region d of the thin film transistor TFT may then be formed. When forming the source region s and the drain region d of the thin film transistor TFT, ion doping may be simultaneously performed in a surface of the intrinsic semiconductor layer 133, converting a portion of the intrinsic semiconductor layer 133 into the second semiconductor layer 132.

In fabrication of the first photosensitive element 13 shown in FIG. 6, when the active layer 16 of the thin film transistor TFT is fabricated, the first semiconductor layer 131 may be simultaneously formed at a corresponding position of the frame area 112 where the alignment mark 13' needs to be fabricated. When the source region s and the drain region d of the thin film transistor TFT are formed, ion doping may be simultaneously performed in a surface of the first semiconductor layer 131, converting a portion of the first semiconductor layer 131 into the second semiconductor layer 132. Finally, the third semiconductor layer 134 may be formed on a surface of the second semiconductor layer 132.

In a configuration shown in FIG. 7, the display panel is an OLED panel, and the sub-pixel 15 is an OLED pixel. The OLED pixel is located on a side of the driving circuit facing away from the substrate 11. The OLED pixel includes an anode 151, an organic light-emitting layer 152 located on a side of the anode 151 facing away from the substrate 11, and a cathode 153 located on a side of the organic light-emitting layer 152 facing away from the anode 151. In this configuration, the second pin 122 is connected to the sub-pixel 15. Specifically, the anode 151 is connected to the drain terminal D of the thin film transistor TFT, and is further connected to the driving circuit, and the driving circuit is connected to the second pin 122 through the data line. Drive current for driving the OLED pixel to emit light may be provided through the data line. A specific circuit structure of the driving circuit of the OLED panel may be a conventional design, and is not specifically limited in the present disclosure.

Figure 8:
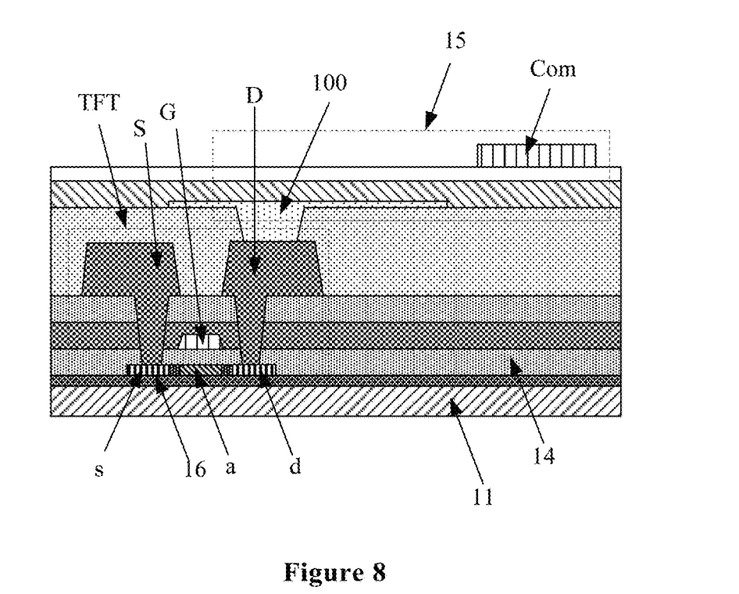
FIG. 8 illustrates a cross-sectional view of another display panel consistent with the disclosed embodiments of the present disclosure.

FIG. 8 illustrates a cross-sectional view of another display panel consistent with the disclosed embodiments of the present disclosure. In a configuration shown in FIG. 8, the display panel is an LCD panel. The structure of the thin film transistor TFT in the driving circuit may refer to the configuration shown in FIG. 7, and is not repeated here. The sub-pixel 15 is a liquid crystal pixel, including a pixel electrode 100 and a common electrode Com. The pixel electrode 100 is connected to the drain terminal D of the thin film transistor TFT, and is insulated from the common electrode Com. The pixel electrode 100 and the common electrode Com may form an electric field for driving the liquid crystal to deflect, such that image display may be realized. A specific circuit structure of the driving circuit in the LCD panel may be a conventional design, and is not specifically limited in the present disclosure.

In a configuration shown in FIG. 8, the second pin 122 is connected to the sub-pixel 15. Specifically, the pixel electrode 100 is connected to the drain terminal D of the thin film transistor TFT, the source terminal S of the thin film transistor TFT is connected to the data line, and the data line is connected to the second pin 122. A data voltage may be input to the pixel electrode 100 through the data line, such that the pixel electrode 100 and the common electrode Com for inputting a common voltage may form an electric field for driving the liquid crystal to deflect, and image display may thus be realized.

In the configurations shown in FIG. 7 and FIG. 8, the thin film transistor TFT may have a top gate structure. That is, the gate G may be located on a side of the channel region facing away from the substrate 11, and a gate dielectric layer 14 may be disposed between the gate G and the channel region a.

Figure 9:
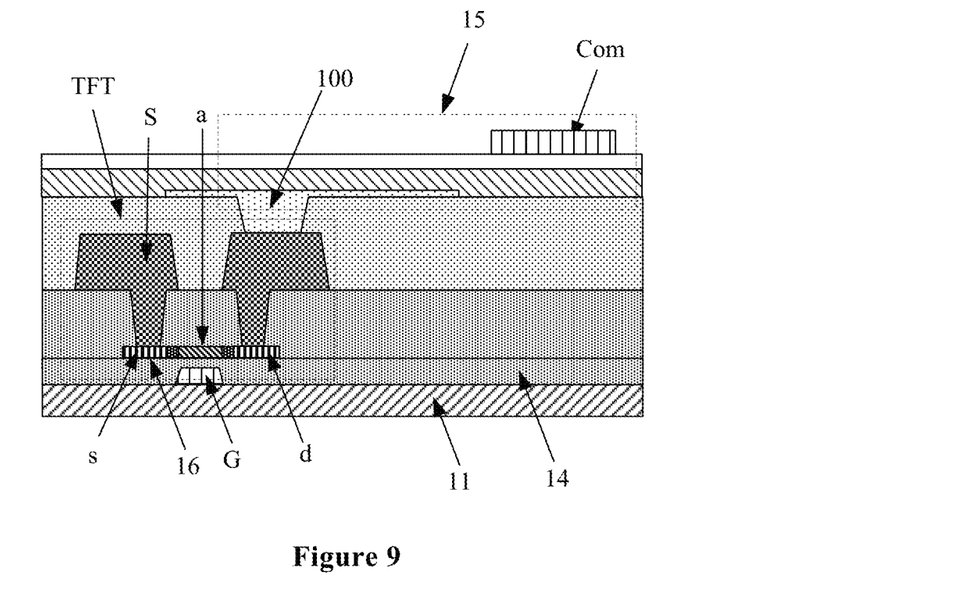
FIG. 9 illustrates a cross-sectional view of another display panel consistent with the disclosed embodiments of the present disclosure.

FIG. 9 illustrates a cross-sectional view of another display panel consistent with the disclosed embodiments of the present disclosure. In a display panel shown in FIG. 9, the thin film transistor TFT includes a bottom gate structure. A gate G is located between the substrate 11 and the channel region a. A gate dielectric layer 14 is disposed between the gate G and the channel region a. FIG. 9 only shows an LCD panel as an example for illustration. An OLED display panel may also include a thin film transistor TFT with a bottom gate structure as shown in FIG. 9.

Figure 10:
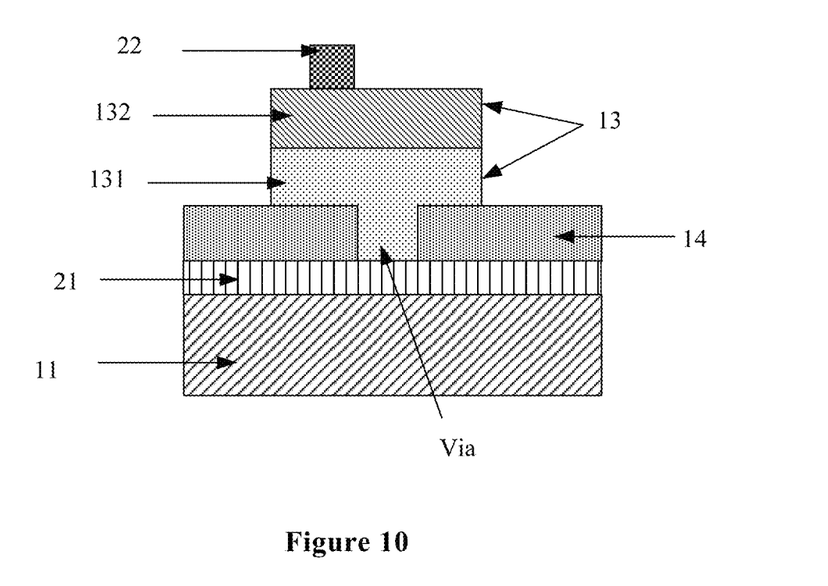
FIG. 10 illustrates a schematic structural diagram of another first photosensitive element consistent with the disclosed embodiments of the present disclosure.

FIG. 10 illustrates a schematic structural diagram of another first photosensitive element consistent with the disclosed embodiments of the present disclosure. As shown in FIG. 10, the photosensitive element 13 also includes a first electrode 21 and a second electrode 22. The first electrode 21 is connected to the first semiconductor layer 131. The second electrode 22 is connected to the second semiconductor layer 132.

With reference to FIG. 7 to FIG. 10, a first metal layer that is patterned may be disposed between the substrate 11 and the sub-pixels. The first metal layer includes a gate G, a scan line, and the first electrode 21. The scan line and the gate G are an integral structure, and are connected in a same layer. The first metal layer is a gate metal layer. The gate metal layer may be multiplexed to fabricate the first electrode 21 of the first photosensitive element 13, and no additional metal layer is required to fabricate the first electrode 21. Accordingly, the fabrication process may be simple, and the fabrication cost may be low.

The thin film transistor TFT includes a gate G. When the thin film transistor TFT has a bottom gate structure as shown in FIG. 9, the gate G may be located between the channel region a and the substrate 11. The first metal layer includes the gate G. With reference to FIG. 9 and FIG. 10, the gate dielectric layer 14 may be disposed between the first metal layer and the active layer 16. In this configuration, the gate dielectric layer 14 is located between the first electrode 21 and the second semiconductor layer 131, and the first semiconductor layer 131 is electrically connected to the first electrode 21 through a via.

In a configuration shown in FIG. 10, the first electrode 21 is located between the first semiconductor layer 131 and the substrate 11, and the second electrode 22 is located on a surface of the second semiconductor layer 132 facing away from the substrate 11. The first semiconductor layer 131 and the second semiconductor layer 132 may be set to completely overlap each other. A manufacturing process of the first semiconductor layer 131 and the second semiconductor layer 132 with a same pattern structure may be simple.

A second metal layer may be disposed on a side of the drain region d and the source region s facing away from the substrate 11. The second metal layer includes a data line and the second electrode 22. The data line is connected to the source region s. The second electrode 22 is located on a surface of the second semiconductor layer 132 facing away from the substrate 11. The second electrode 22 covers a portion of the second semiconductor layer 132, and a portion of the second semiconductor layer 132 is exposed, such that photo-sensation may be realized. The second metal layer includes a source terminal S of the thin film transistor TFT. The source terminal S is connected to the source region s. The data line and the source terminal S are an integral structure, and are connected in a same layer. The second metal layer is a source and drain metal layer. The source and drain metal layer may be multiplexed to make the second electrode 22 of the first photosensitive element 13, and no additional metal layer is needed to make the second electrode 22. Accordingly, the fabrication process may simple, and the fabrication cost may be low.

Figure 11:
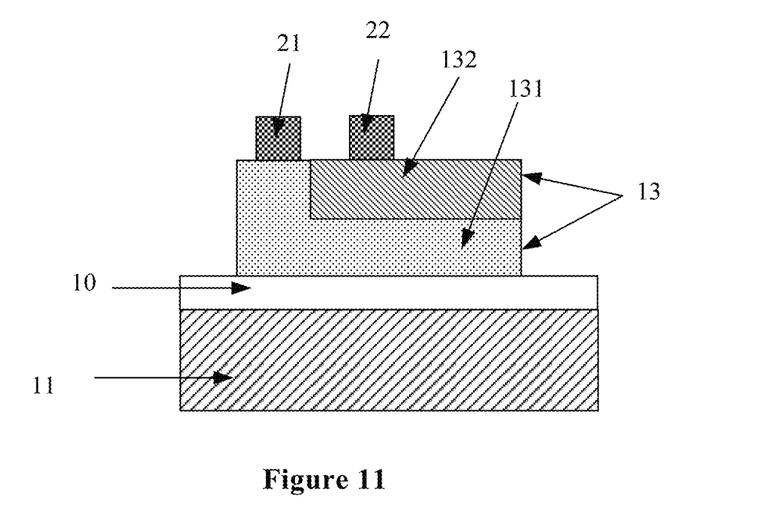
FIG. 11 illustrates a schematic structural diagram of another first photosensitive element consistent with the disclosed embodiments of the present disclosure.

FIG. 11 illustrates a schematic structural diagram of another first photosensitive element consistent with the disclosed embodiments of the present disclosure. As shown in FIG. 11, in this configuration, the first semiconductor layer 131 and the second semiconductor layer 132 do not completely overlap. A vertical projection of the second semiconductor layer 132 on the first semiconductor layer 131 is completely located in the first semiconductor layer 131. The second semiconductor layer 132 exposes a portion of a surface of the first semiconductor layer 131 facing away from the substrate 11, and the first electrode 21 is located on the portion of the surface of the first semiconductor layer 131.

In the configuration shown in FIG. 11, the thin film transistor TFT may include a bottom gate structure or a top gate structure. Each of the first electrode 21 and the second electrode 22 may be made of the second metal layer.

Figure 12:
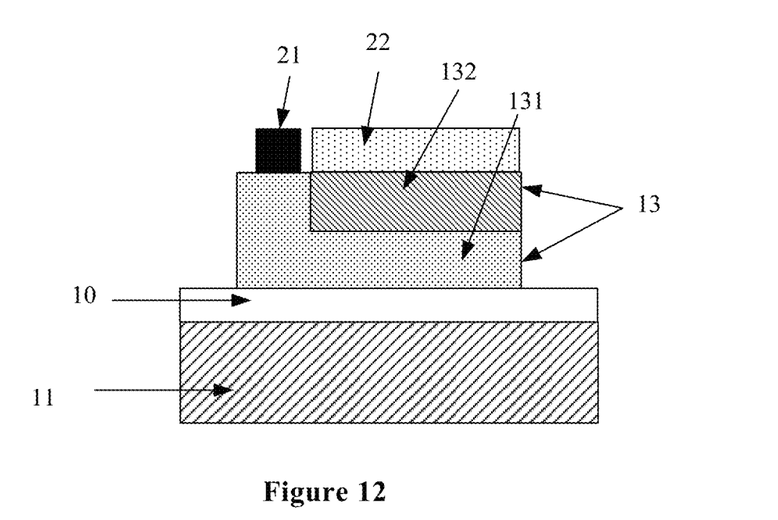
FIG. 12 illustrates a schematic structural diagram of another first photosensitive element consistent with the disclosed embodiments of the present disclosure.

FIG. 12 illustrates a schematic structural diagram of another first photosensitive element consistent with the disclosed embodiments of the present disclosure. As shown in FIG. 12, the first photosensitive element 13 includes a first semiconductor layer 131 and a second semiconductor layer 132, and also includes a first electrode 21 and a second electrode 22. The first electrode 21 is connected to the first semiconductor layer 131. The second electrode 22 is connected to the second semiconductor layer 132.

As shown in FIG. 7 and FIG. 12, the sub-pixel 15 includes an anode 151, an organic light-emitting layer 152 and a cathode 153 that are stacked in the first direction. The first semiconductor layer 131 and the second semiconductor layer 132 do not completely overlap. A vertical projection of the second semiconductor layer 132 on the first semiconductor layer 131 is completely located in the first semiconductor layer 131. The second semiconductor layer 132 exposes a portion of a surface of the first semiconductor layer 131 facing away from the substrate 11, and the first electrode 21 is located on the portion of the surface of the first semiconductor layer 131. The first electrode 21 and the anode 151 are made of a same material. The anode metal layer of the OLED pixel may be multiplexed as the first electrode 21, and no separate metal layer is needed to make the first electrode 21. Accordingly, the process may be simple, and the cost may be low. In addition, the anode 151 is made of metal, and may have low impedance. The second electrode 22 and the cathode 153 are made of a same material. The cathode layer of the OLED pixel may be multiplexed as the second electrode 22, and no separate metal layer is needed to make the second electrode 22. Accordingly, the process may be simple, and the cost may be low. The cathode layer is a transparent conductive layer, such as ITO. The cathode layer may completely cover the surface of the second semiconductor layer 132, such that the second electrode 22 may have a larger area, and impedance may be reduced.

As shown in FIG. 12, each of the second semiconductor layer 132 and the first electrode 21 is located on a side of the first semiconductor layer 131 facing away from the substrate 11. Moreover, the second semiconductor layer 132 and the first electrode 21 are spaced apart, and are not connected. In the first direction, the first semiconductor layer 131 includes a portion that does not overlap with the second semiconductor layer 132, and the first electrode 21 is located on a surface of the portion facing away from the substrate 11. The second electrode 22 completely covers a surface of the second semiconductor layer 132 facing away from the substrate 11.

The present disclosure is not limited to multiplexing the first metal layer, the second metal layer, the anode metal layer, and the cathode layer to make the electrode of the first photosensitive element 13. Other metal layers in the display panel may also be multiplexed to make the electrodes of the first photosensitive element 13. For example, the display panel may also include a capacitive metal layer and a third metal layer, and the third metal layer may include a touch electrode. Each of the first electrode 21 and the second electrode 22 of the first photosensitive element 13 may multiplex any film layers on the first metal layer, the second metal layer, the anode metal layer, the cathode layer, the capacitor metal layer, and the third metal layer.

Figure 13:
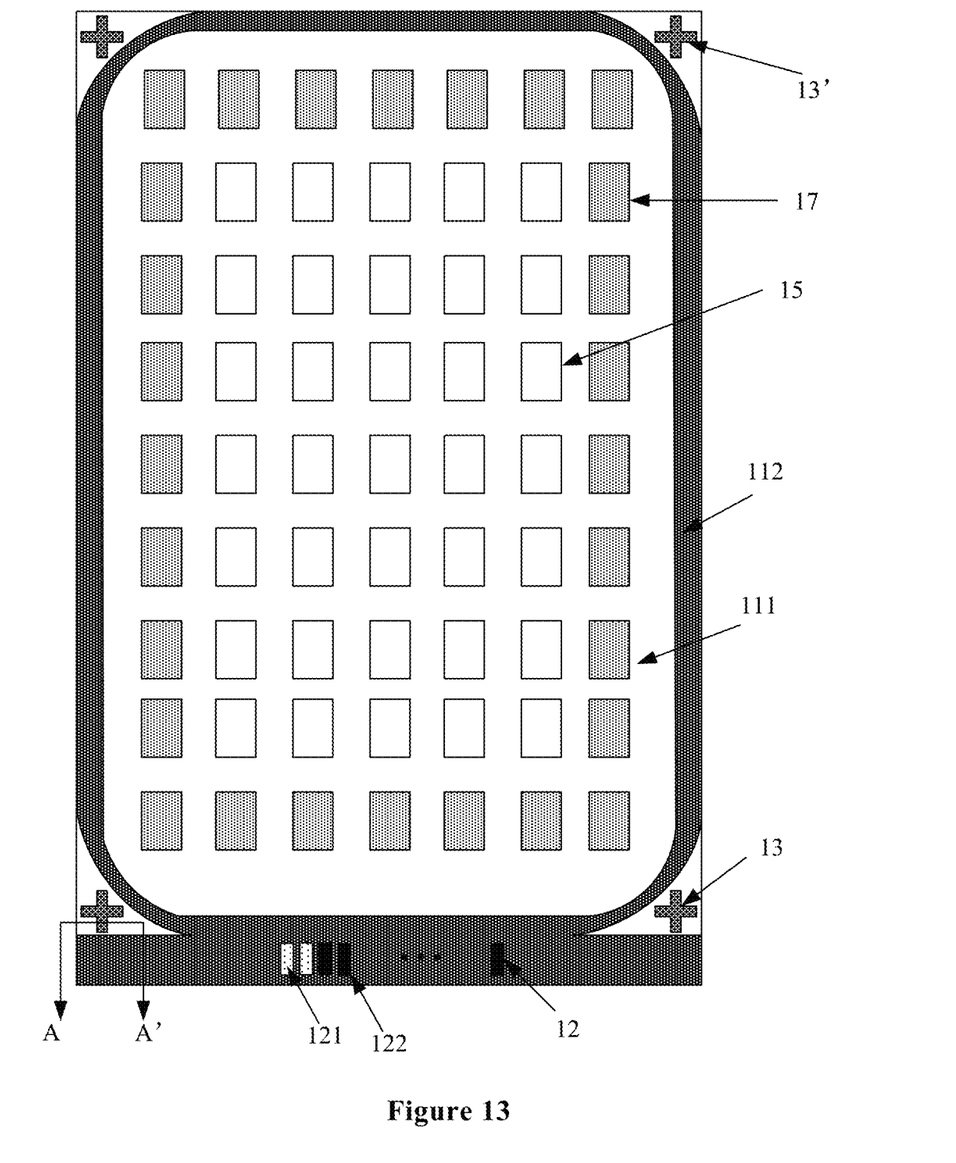
FIG. 13 illustrates a schematic structural diagram of another display panel consistent with the disclosed embodiments of the present disclosure.

FIG. 13 illustrates a schematic structural diagram of another display panel consistent with the disclosed embodiments of the present disclosure. Based on the configuration shown in FIG. 2, the configuration shown in FIG. 13 further includes a second photosensitive element 17. The second photosensitive element 17 is located in the display area 111 and is located in an area of the display area 111 close to the frame area 112.

The second photosensitive element 17 may include a first semiconductor layer and a second semiconductor layer that are stacked in a first direction. One of the first semiconductor layer and the second semiconductor layer is a P-type semiconductor layer, and the other is an N-type semiconductor layer. The first direction is directed from the substrate 11 to the sub-pixel 15. The second photosensitive element 17 and the first photosensitive element 13 may have a same structure and implementation.

A layout of the second photosensitive element 17 includes at least one of four configurations, including configurations 1 to 4. In configuration 1, at least one second photosensitive element 17 is disposed between a first row of sub-pixels 15 and an adjacent edge of the display area. In configuration 2, at least one second photosensitive element 17 is disposed between a last row of sub-pixels 15 and an adjacent edge of the display area. In configuration 3, at least one second photosensitive element 17 is disposed between a first column of sub-pixels 15 and an adjacent edge of the display area. In configuration 4, at least one second photosensitive element 17 is disposed between a last column of sub-pixels 15 and an adjacent edge of the display area.

In one embodiment, as shown in FIG. 13, thin film transistors connected to each of the sub-pixels 15 at an outermost rim are taken as the second photosensitive elements 17. In some other embodiments, thin film transistors connected to part of the sub-pixels 15 in the outermost rim are taken as the second photosensitive elements 17.

For a thin film transistor taken as the second photosensitive element 17, one of the source terminal and the drain terminal may serve as a first electrode of the second photosensitive element 17, and the other may serve as a second electrode of the photosensitive element 17. In one embodiment, the gate terminal and the source terminal are short-circuited to form a photosensitive diode structure. In some other embodiments, the gate terminal and the drain terminal are short-circuited to form a photosensitive diode structure.

As shown in FIG. 13, a whole row and/or a whole column of the sub-pixels 15 at the edge are taken as pseudo sub-pixels. The pseudo sub-pixels may not display images. Thin film transistors of the pseudo sub-pixels may be used to detect light information. Since the sub-pixels 15 have a small size, compared with a conventional way of grooving an end of the display panel, the configuration shown in FIG. 13 may have little effect on a size of the display area.

When the display panel is an OLED panel, the pseudo sub-pixel does not include an anode and an organic light-emitting layer of an OLED pixel, and the thin film transistor under the anode is exposed, such that the thin film transistor may be used as the second photosensitive elements 17. When the display panel is an LCD panel, the pseudo sub-pixel does not include color resistance of an LCD pixel, and the thin film transistor under the color resistance is exposed, such that the thin film transistor may be used as the second photosensitive element 17.

Figure 14:
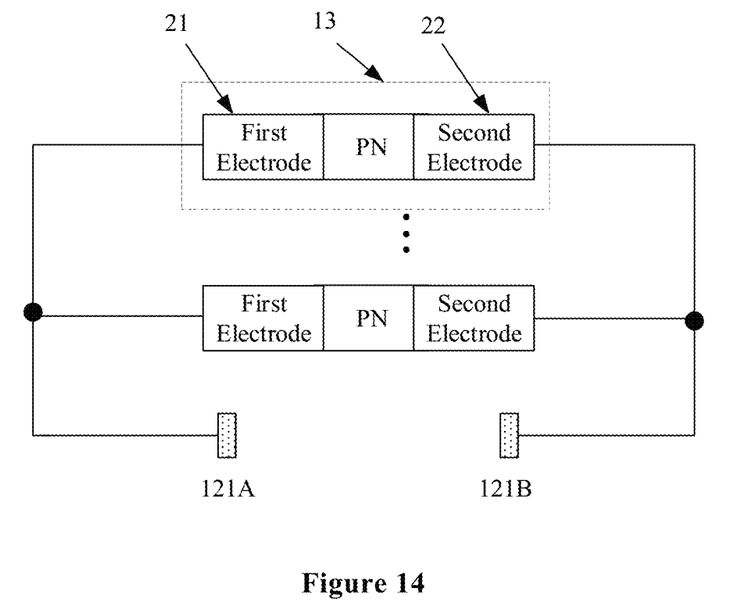
FIG. 14 illustrates a circuit diagram of first photosensitive elements connected in parallel, consistent with the disclosed embodiments of the present disclosure.

FIG. 14 illustrates a circuit diagram of first photosensitive elements connected in parallel, consistent with the disclosed embodiments of the present disclosure. As shown in FIG. 14, when only the first photosensitive element 13 is disposed, and the display panel includes a plurality of first photosensitive elements 13, the plurality of first photosensitive elements 13 may be arranged in parallel. As described above, each first photosensitive element 13 includes a first electrode 21 and a second electrode 22. The display panel includes two first pins 121, and the two first pins 121 are a first electrode pin 121A and a second electrode pin 121B, respectively.

In a configuration shown in FIG. 14, the first electrode 21 of each first photosensitive element 13 is connected to the first electrode pin 121A, and the second electrode 22 of each first photosensitive element 13 is connected to the second electrode pin 121B. In this configuration, each first photosensitive element 13 of the plurality of first photosensitive elements 13 is connected in parallel, and the current obtained by the first electrode pin 121A and the second electrode pin 121B is a sum of photogenerated current of each first photosensitive element 13. Accordingly, in this configuration, by using the current of the first electrode pin 121A and the second electrode pin 121B to detect intensity of light signals, sensitivity of photo-sensation may be improved.

Figure 15:
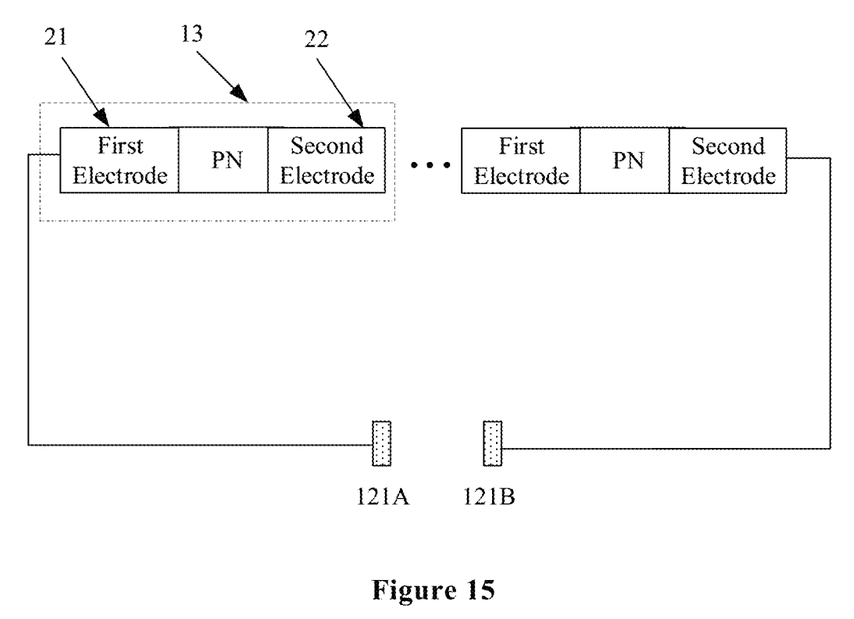
FIG. 15 illustrates a circuit diagram of first photosensitive elements connected in series, consistent with the disclosed embodiments of the present disclosure.

FIG. 15 illustrates a circuit diagram of first photosensitive elements connected in series, consistent with the disclosed embodiments of the present disclosure. When only the first photosensitive element 13 is disposed, and the display panel includes a plurality of first photosensitive elements 13, the plurality of first photosensitive elements 13 may be arranged in series. As described above, each first photosensitive element 13 includes a first electrode 21 and a second electrode 22. The display panel includes two first pins 121, and the two first pins 121 are a first electrode pin 121A and a second electrode pin 121B, respectively.

In the configuration shown in FIG. 15, the display panel includes M first photosensitive elements 13. The M first photosensitive elements 131 include sequentially a first-level first photosensitive element to an M-th level first photosensitive element, and M is a positive integer. The second electrode 22 of the j-th level first photosensitive element is connected to the first electrode of the (j+1)-th level first photosensitive element, where j is a positive integer, and (j+1) is not greater than M. The first electrode 21 of the first-level first photosensitive element is connected to the first electrode pin 121A, and the second electrode 22 of the M-th level first photosensitive element is connected to the second electrode pin 121B. In this configuration, the plurality of first photosensitive elements 13 are connected in series, and voltage obtained by the first electrode pin 121A and the second electrode pin 121B is a sum of the photo-generated voltage of each first photosensitive element 13. Accordingly, in this configuration, by using the voltage of the first electrode pin 121A and the second electrode pin 121B to detect intensity of light signals, sensitivity of photo-sensation may be improved.

Figure 16:
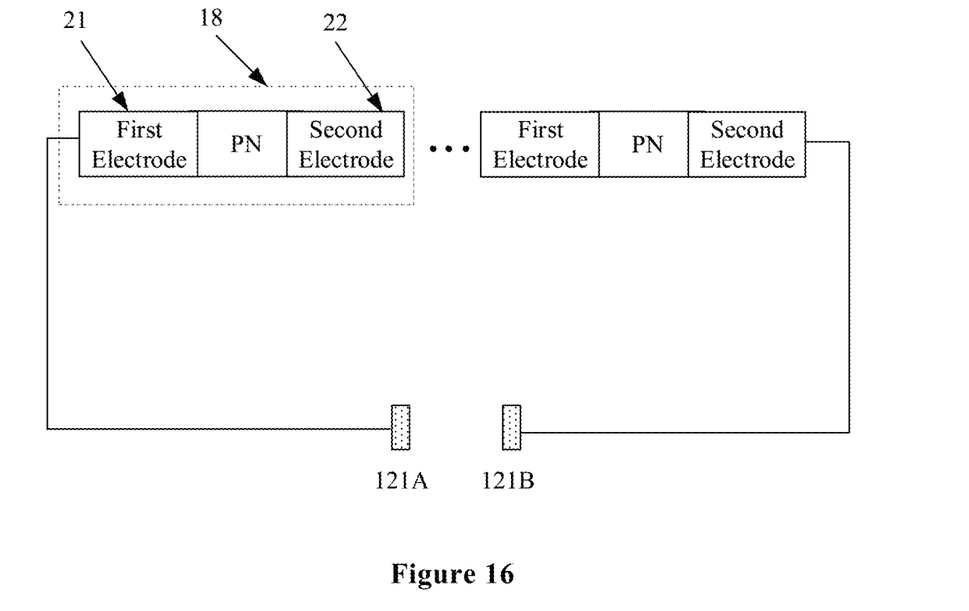
FIG. 16 illustrates a circuit diagram of photosensitive units connected in series, consistent with the disclosed embodiments of the present disclosure.

FIG. 16 illustrates a circuit diagram of photosensitive units connected in series, consistent with the disclosed embodiments of the present disclosure. When the display panel includes the first photosensitive element 13 and the second photosensitive element 17 simultaneously, each of the first photosensitive element 13 and the second photosensitive element 17 may be set to be a photosensitive unit 18. Each photosensitive unit 18 includes a first electrode 21 and a second electrode 22. The display panel includes two first pins 121, and the two first pins 121 are a first electrode pin 121A and a second electrode pin 121B, respectively.

In the configuration shown in FIG. 16, each photosensitive unit 18 is connected in series. A sum of numbers of the first photosensitive elements and the second photosensitive elements is N, where N is an integer greater than 1. The N photosensitive units 18 are sequentially a first-level photosensitive unit to a N-th level photosensitive unit. The second electrode 22 of the i-th level photosensitive unit is connected to the first electrode 21 of the (i+1)-th level photosensitive unit, where i is a positive integer, and (i+1) is not greater than N. The first electrode 21 of the first-level photosensitive unit is connected to the first electrode pin 121A, and the second electrode 22 of the N-th-level photosensitive unit is connected to the second electrode pin 121B. In this configuration, since each photosensitive unit 18 is connected in series, a voltage obtained by the first electrode pin 121A and the second electrode pin 121B is a sum of the photogenerated voltage of each photosensitive unit 18. Accordingly, in this configuration, by using the voltage of the first electrode pin 121A and the second electrode pin 121B to detect intensity of light signals, sensitivity of photo-sensation may be improved.

Figure 17:
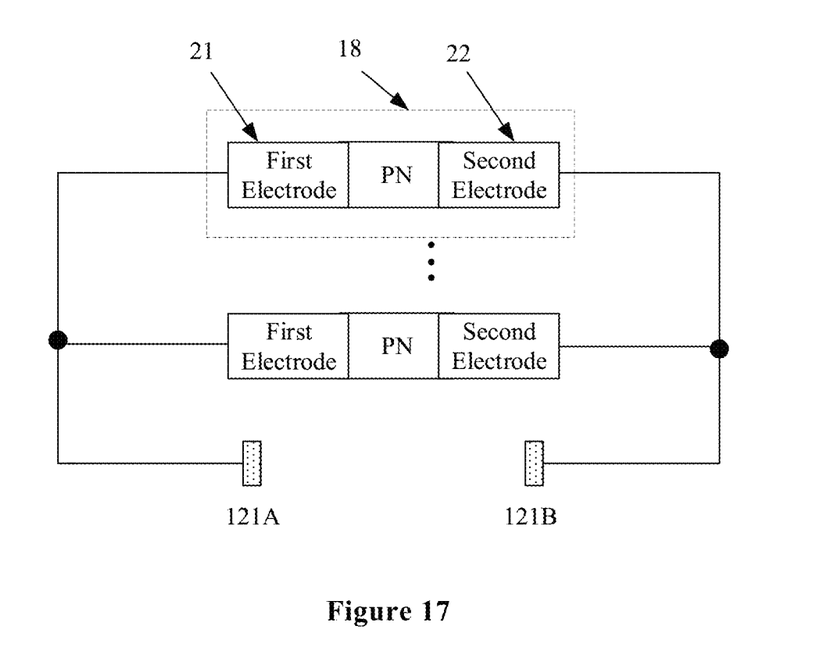
FIG. 17 illustrates a circuit diagram of photosensitive units connected in parallel, consistent with the disclosed embodiments of the present disclosure.

FIG. 17 illustrates a circuit diagram of photosensitive units connected in parallel, consistent with the disclosed embodiments of the present disclosure. When the display panel includes the first photosensitive element 13 and the second photosensitive element 17 simultaneously, each of the first photosensitive element 13 and the second photosensitive element 17 may be set to be a photosensitive unit 18. Each photosensitive unit 18 includes a first electrode 21 and a second electrode 22. The display panel includes two first pins 121, and the two first pins 121 are a first electrode pin 121A and a second electrode pin 121B, respectively.

In the configuration shown in FIG. 17, each photosensitive unit 18 is connected in parallel. The first electrode 21 of each photosensitive unit 18 is connected to the first electrode pin 121A, and the second electrode 22 of each photosensitive unit 18 is connected to the second electrode pin 121B. In this configuration, since each photosensitive unit 18 is connected in parallel, current obtained by the first electrode pin 121A and the second electrode pin 121B is a sum of photogenerated current of each photosensitive unit 18. Accordingly, in this configuration, by using current of the first electrode pin 121A and the second electrode pin 121B to detect intensity of light signals, sensitivity of photo-sensation may be improved.

In FIGS. 14 to 17, the photosensitive element includes a PN structure as an example for description. In some other embodiments, the photosensitive element may include a PIN structure or an NPN structure.

Figure 18:
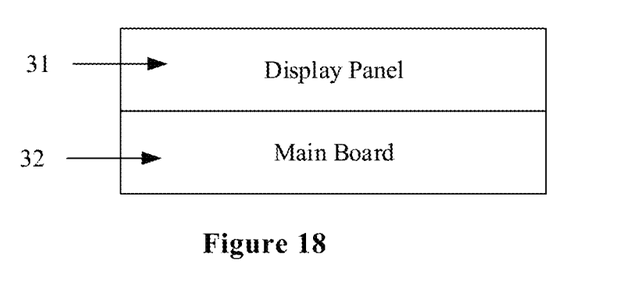
FIG. 18 illustrates a schematic structural diagram of an electronic device consistent with the disclosed embodiments of the present disclosure.
Figure 19:
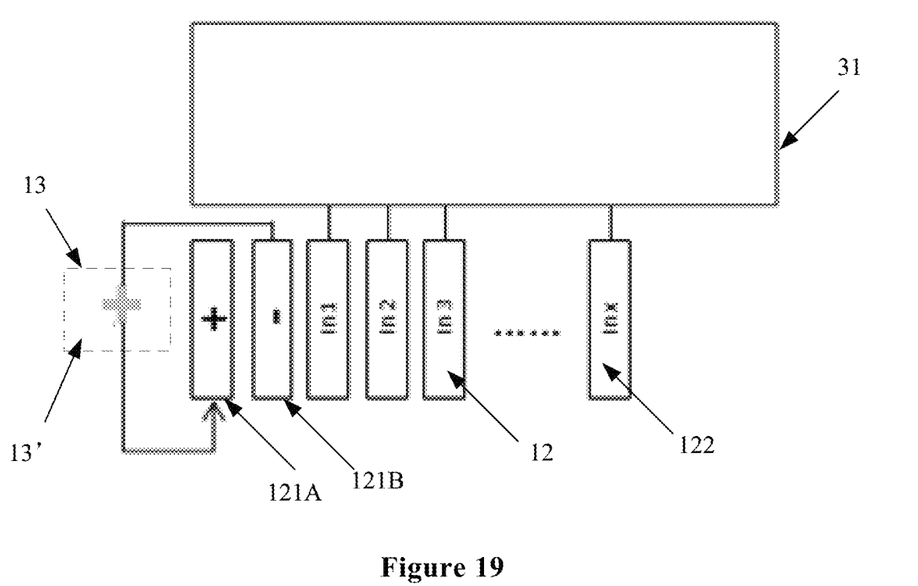
FIG. 19 illustrates a partially enlarged diagram of a display panel consistent with the disclosed embodiments of the present disclosure.

FIG. 18 illustrates a schematic structural diagram of an electronic device consistent with the disclosed embodiments of the present disclosure. FIG. 19 illustrates a partially enlarged diagram of a display panel. As shown in FIG. 18 and FIG. 19, the electronic device includes a display panel 31 and a main board 32. The main board 32 is located on a side of the display panel 31 facing away from the light-emitting side.

The display panel includes a substrate 11 including a display area 111 and a frame area 112 surrounding the display area 111, a plurality of sub-pixels 15 located in the display area 111, and a plurality of pins 12 and a plurality of alignment marks 13' located in the frame area 112. The plurality of pins 12 include a first pin 121 and a second pin 122. At least one of the plurality of alignment marks 13' is a first photosensitive element 13. The first photosensitive element 13 is connected to the first pin 121. The second pin 122 is connected to the sub-pixel 15. The first pin 121 and the second pin 122 of the display panel 31 are connected to the main board 32.

In the electronic device provided by the present disclosure, the display panel 31 may be any display panel provided by the present disclosure. For implementation of the display panel, reference may be made to the embodiments of the present disclosure, and details are not repeated here.

The electronic device may also include a flexible printed circuit (FPC). The FPC may include third pins. The third pins are connected to the first pins 121 and the second pins 122 in one-to-one correspondence. The alignment marks on the display panel 31 may be used as a comparison reference when the FPC is connected to the display panel. The FPC may be connected to the main board, or a control chip may be separately bound to the FPC.

As shown in FIG. 19, the first pin 121 includes a first electrode pin 121A and a second electrode pin 121B. One first photosensitive element 13 is shown in FIG. 19. The two electrodes of the first photosensitive element 13 are respectively connected to the first electrode pin 121A and the second electrode pin 121B. In addition, x second pins 122 are shown in FIG. 19, and the x second pins 122 includes second pins In1 to Inx in sequence.

In one embodiment, the frame area of the display panel 31 includes a plurality of alignment marks 13'. The display panel has a binding area for disposing the first pin 121 and the second pin 122. The alignment mark 13' adjacent to the binding area may be used as an alignment reference between the array substrate of the display panel and the FPC. When the display panel is placed vertically, the binding area may be set at a lower end of the display panel, and one alignment mark 13' may be disposed on each of left and right sides of the binding area. The alignment mark 13' may be used as an alignment reference in binding the FPC on the display panel. One alignment mark 13' may also be disposed on each of left and right sides of the upper end of the display panel. The alignment mark may be used as an alignment reference in binding a camera or other electronic components on the upper end of the display panel.

In one embodiment, the electronic device may include a display panel provided by the present disclosure, and the alignment mark may be multiplexed as the photosensitive element. The photosensitive element may be integrated in the display panel without designing a groove in the display panel. A manufacturing process may be simple, and a manufacturing cost may be low.

As disclosed, the technical solutions of the present disclosure have the following advantages.

In the electronic device provided by the present disclosure, at least one alignment mark in the frame area of the display panel is multiplexed as a first photosensitive element. Accordingly, the first photosensitive element may not occupy an area of the display area. Moreover, the photosensitive sensor may be integrated without a groove. Thus, the production cost may be reduced, and the screen-to-body ratio of the display panel may be increased.

The embodiments disclosed herein are exemplary only and not limiting the scope of this disclosure. Various combinations, alternations, modifications, equivalents, or improvements to the technical solutions of the disclosed embodiments can be obvious to those skilled in the art. Without departing from the spirit and scope of this disclosure, such combinations, alternations, modifications, equiva-lents, or improvements to the disclosed embodiments are intended to be encompassed within the scope of the present disclosure.

What is claimed is:

1. A display panel, comprising:
   a substrate, including a display area and a frame area surrounding the display area;
   a plurality of sub-pixels located in the display area; and
   a plurality of pins and a plurality of alignment marks located in the frame area,
   wherein:
      the plurality of pins includes a first pin and a second pin;
      at least one alignment mark of the plurality of alignment marks is a first photosensitive element;
      the first photosensitive element is connected to the first pin; and
      the second pin is connected to the plurality of sub-pixels.

2. The display panel according to claim 1, wherein:
   the first photosensitive element includes a first semiconductor layer and a second semiconductor layer stacked in a first direction;
   one of the first semiconductor layer and the second semiconductor layer is a P-type semiconductor layer, and an other is an N-type semiconductor layer; and
   the first direction is directed from the substrate to the plurality of sub-pixels.

3. The display panel according to claim 2, further comprising:
   an intrinsic semiconductor layer located between the first semiconductor layer and the second semiconductor layer.

4. The display panel according to claim 2, further comprising:
   a third semiconductor layer located on a side of the second semiconductor layer facing away from the first semiconductor layer, wherein:
      the first semiconductor layer and the third semiconductor layer have a same doping type.

5. The display panel according to claim 2, wherein:
   the second pin is connected to the plurality of sub-pixels through a driving circuit;
   the driving circuit includes a thin film transistor including an active layer, wherein the active layer includes a source region, a drain region, and a channel region located between the source region and the drain region;
   the source region and the drain region have a same doping type, and the source region and the channel region have different doping types;
   the first semiconductor layer and the channel region are made of a same material; and
   the second semiconductor layer, the source region, and the drain region d are made of a same material.

6. The display panel according to claim 5, wherein:
   the photosensitive element further includes a first electrode and a second electrode, wherein the first electrode is connected to the first semiconductor layer, and the second electrode is connected to the second semiconductor layer; and
   a first metal layer is disposed between the substrate and the plurality of sub-pixels, wherein the first metal layer is patterned, and includes a scan line and the first electrode.

7. The display panel according to claim 6, wherein:
   the thin film transistor includes a gate, located between the channel region and the substrate;

the first metal layer includes the gate;
a gate dielectric layer is disposed between the first metal layer and the active layer; and
the first semiconductor layer is electrically connected to the first electrode through a via.

8. The display panel according to claim 6, wherein:
a second metal layer is disposed on a side of the drain region and the source region facing away from the substrate;
the second metal layer includes a data line and the second electrode, wherein the data line is connected to the source region; and
the second electrode is located on a surface of the second semiconductor layer facing away from the substrate, and the second electrode covers a portion of the second semiconductor layer.

9. The display panel according to claim 5, wherein:
a sub-pixel of the plurality of sub-pixels includes an anode, an organic light-emitting layer, and a cathode stacked in the first direction;
the first photosensitive element further includes a first electrode and a second electrode, wherein the first electrode is connected to the first semiconductor layer, and the second electrode is connected to the second semiconductor layer; and
the first electrode and the anode are made of a same material, and the second electrode and the cathode are made of a same material.

10. The display panel according to claim 9, wherein:
each of the second semiconductor layer and the first electrode is located on a side of the first semiconductor layer facing away from the substrate, and the second semiconductor layer and the first electrode are spaced apart;
in the first direction, the second semiconductor layer exposes a portion of the first semiconductor layer, and the first electrode is located on a surface of the portion of the first semiconductor layer facing away from the substrate; and
the second electrode completely covers a surface of the second semiconductor layer facing away from the substrate.

11. The display panel according to claim 1, further comprising:
a second photosensitive element, wherein the second photosensitive element is located in a region of the display area close to the frame area.

12. The display panel according to claim 11, wherein:
the second photosensitive element includes a first semiconductor layer and a second semiconductor layer stacked in a first direction, wherein:
one of the first semiconductor layer and the second semiconductor layer is a P-type semiconductor layer, and the other is an N-type semiconductor layer; and
the first direction is directed from the substrate to the plurality of sub-pixels.

13. The display panel according to claim 11, wherein:
the display panel includes two first pins, including a first electrode pin and a second electrode pin;
each of the first photosensitive element and the second photosensitive element is a photosensitive unit, and the photosensitive unit includes a first electrode and a second electrode;
the display panel includes N photosensitive units sequentially including a first-level photosensitive unit to a N-th level photosensitive unit, wherein N is a sum of numbers of the first photosensitive elements and the second photosensitive elements, and N is an integer greater than 1;
the second electrode of the i-th level photosensitive unit is connected to the first electrode of the (i+1)-th level photosensitive unit, wherein i is a positive integer, and (i+1) is not greater than N; and
the first electrode of the first-level photosensitive unit is connected to the first electrode pin, and the second electrode of the N-th-level photosensitive unit is connected to the second electrode pin.

14. The display panel according to claim 11, wherein:
the display panel includes two first pins, including a first electrode pin and a second electrode pin;
each of the first photosensitive element and the second photosensitive element is a photosensitive unit, and the photosensitive unit includes a first electrode and a second electrode;
the first electrode of each photosensitive unit is connected to the first electrode pin; and
the second electrode of each photosensitive unit is connected to the second electrode pin.

15. The display panel according to claim 1, wherein:
a vertical projection of the first photosensitive element on a plane where the substrate is located has one of shapes including a cross shape, a circle shape, a polygon shape, an ellipse shape, a straight-line shape, and a polyline shape.

16. The display panel according to claim 1, further comprising a cover plate, wherein:
the cover plate is disposed on a side of the plurality of sub-pixels facing away from the substrate;
a surface of the cover plate includes an ink layer, and the ink layer is disposed on a surface of the cover plate facing the substrate; and
the ink layer exposes the display area and the first photosensitive element.

17. The display panel according to claim 16, wherein:
the display area has a rounded rectangle shape; and
each region of the frame area adjacent to one of four rounded regions of the rounded rectangle shape is disposed with one alignment mark.

18. The display panel according to claim 1, wherein:
a whole row or a whole column of the plurality of sub-pixels at an edge of the display area are pseudo sub-pixels, wherein:
the pseudo sub-pixels do not display images; and
thin film transistors of the pseudo sub-pixels are used to detect light information.

19. An electronic device, comprising:
a display panel; and
a main board, located on a side of the display panel facing away from the light-emitting side,
wherein:
the display panel includes:
a substrate, including a display area and a frame area surrounding the display area;
a plurality of sub-pixels located in the display area; and
a plurality of pins and a plurality of alignment marks located in the frame area,
wherein:
the plurality of pins includes a first pin and a second pin;
at least one alignment mark of the plurality of alignment marks is a first photosensitive element;
the first photosensitive element is connected to the first pin; and the second pin is connected to the plurality of sub-pixels, and the first pin and the second pin of the display panel are connected to the main board.

20. The electronic device according to claim 19, further comprising a flexible printed circuit, wherein:

the flexible printed circuit includes third pins, and the third pins are connected to the first pins and the second pins in one-to-one correspondence.

* * * * *